United States Patent [19]

Hara et al.

[11] Patent Number: 5,327,459
[45] Date of Patent: Jul. 5, 1994

[54] SEMICONDUCTOR INTEGRATED CIRCUIT CONTAINING AN AUTOMATIC EQUALIZER INCLUDING A CIRCUIT FOR PERIODICALLY UPDATING A PLURALITY OF TAP COEFFICIENTS AT VARYING FREQUENCIES

[75] Inventors: Hirotaka Hara, Kodaira; Masaru Kokubo, Hachioji; Toshiro Suzuki, Tama, all of Japan

[73] Assignee: Hitachi, Ltd., Tokyo, Japan

[21] Appl. No.: 697,669

[22] Filed: May 9, 1991

[30] Foreign Application Priority Data

May 11, 1990 [JP] Japan ............... 2-122303

[51] Int. Cl.$^5$ ............................................. H03H 15/00
[52] U.S. Cl. ................................. 375/14; 375/12; 364/724.2; 364/724.16
[58] Field of Search ............... 375/12, 14, 15; 333/18, 333/28 R; 364/724.01, 724.16, 724.19, 724.2, 825; 370/32, 32.1

[56] References Cited

U.S. PATENT DOCUMENTS

| | | | |
|---|---|---|---|
| 4,438,521 | 3/1984 | Mattei | 333/18 |
| 4,694,969 | 9/1987 | Sellenberger | 333/18 |
| 4,805,215 | 2/1989 | Miller | 379/411 |
| 4,862,484 | 8/1989 | Roberts | 275/14 |
| 4,920,530 | 4/1990 | Wonda et al. | 333/18 |
| 4,947,362 | 8/1990 | Bui | 364/724.19 |
| 5,068,873 | 11/1991 | Murakami | 375/14 |

FOREIGN PATENT DOCUMENTS

| | | |
|---|---|---|
| 59-139717 | 4/1984 | Japan . |
| 59-72237 | 8/1984 | Japan . |
| 60-206232 | 7/1985 | Japan . |
| 8203145 | 9/1982 | PCT Int'l Appl. . |
| 2166329 | 4/1986 | United Kingdom ................... 375/14 |

*Primary Examiner*—Stephen Chin
*Assistant Examiner*—Young Tse
*Attorney, Agent, or Firm*—Fay, Sharpe, Beall, Fagan, Minnich & McKee

[57] ABSTRACT

An automatic equalizer is capable of updating tap coefficients and constituted to vary the frequency at which to update the tap coefficients depending on the magnitude thereof. There are provided a plurality of ways to vary the frequency at which to update the tap coefficients. One way is to divide the taps into two groups, one group having its tap coefficients updated at a relatively high frequency, the other group having its tap coefficients updated at a relatively low frequency. Another way is to vary the frequency at which to update the tap frequency based on the result of suitably judging the magnitude thereof.

17 Claims, 7 Drawing Sheets

SEMICONDUCTOR INTEGRATED CIRCUIT CONTAINING AN AUTOMATIC EQUALIZER INCLUDING A CIRCUIT FOR PERIODICALLY UPDATING A PLURALITY OF TAP COEFFICIENTS AT VARYING FREQUENCIES

BACKGROUND OF THE INVENTION

The present invention relates to a semiconductor integrated circuit containing an automatic equalizer or an adaptive digital filter and the circuits associated therewith and, more particularly, to a semiconductor integrated circuit applied to an echo canceler type transmitting device for data transmission over telephone lines.

Where telephone lines or similar circuits are used for voice and data transmission, the transmission line characteristic is known to fluctuate. Thus an automatic equalizer is incorporated in the receiver or in the transmitter, the coefficient of the equalizer being varied in accordance with the transmission line characteristic as it changes.

The prior art automatic equalizer is generally constituted by a transversal filter. The operations of the filter fall into two categories: those for generating a filter output value based on input data and tap coefficients (called output operations), and those for modifying tap coefficients by use of the filter output value, the difference from an ideal filter output value, and the input data (called update operations).

Meanwhile, improvements in the digital signal processor (DSP) technology of late years have made it possible to implement an automatic equalizer using a DSP. Although the typical DSP seeks to improve the efficiency of multiply and add operations, there are limits to the amount of operations that may be performed within a given sampling time. This disadvantage appears to have been minimized by the automatic equalizer proposed in Japanese Patent Laid-Open No. 59-139717. The proposed equalizer is designed to lower the amount of operations per sampling time.

However, the abovementioned prior art automatic equalizer has two disadvantages. One disadvantage is that in its training period, the proposed automatic equalizer provides a slower convergence of tap coefficients than other equalizers which update the coefficients in each sampling period. The other disadvantage is that in a system where the characteristic of the line for transmitting sampled data continuously changes, the follow-up characteristic of the automatic equalizer tends to deteriorate.

Japanese Patent Laid-Open No. 60-206232 discloses a method for updating part of the tap coefficients involved in the initial stage of training and for updating all tap coefficients from the middle stage of training onward. One disadvantage of this method is that because all tap coefficients need to be updated in each sampling period from the middle stage of training onward, the number of the taps with the automatic equalizer must be limited under constraints of the throughput of the digital signal processor.

SUMMARY OF THE INVENTION

It is therefore an object of the present invention to overcome the above and other deficiencies and disadvantages of the prior art and to provide an equalizer which reduces the amount of operations for updating tap coefficients while providing an equalizing characteristic substantially equivalent to that of conventional automatic equalizers which update all tap coefficients in every sampling period.

It is another object of the present invention to provide a semiconductor integrated circuit for digital signal processing, the circuit affording a capability to converge tap coefficients as well as a capability to follow up on the characteristic fluctuation over the transmission line for sampled data, the two capabilities being substantially the same as those of automatic equalizers that update all tap coefficients in each sampling period.

The above and other related objects and features of the invention, as well as the novelty thereof, will clearly appear from the following description and from the accompanying drawings.

Representative features of the present invention are summarized as follows:

An automatic equalizer according to the invention is capable of updating tap coefficients and is designed to vary the frequency at which to update the tap coefficients depending on the magnitude thereof.

One method for varying the frequency at which to update tap coefficients involves dividing them into a plurality of groups, some groups comprising taps whose coefficients are updated at relatively high frequencies, other groups containing taps whose coefficients are updated at lower frequencies. Another method for varying the frequency at which to vary the tap coefficients involves doing so on the basis of the magnitude of the tap coefficients.

Specifically, the first method involves setting different tap coefficient updating frequencies for different groups. Illustratively, one group has its tap coefficients updated in each sampling period; another group has its tap coefficients updated every m ($m \geq 2$) sampling periods; yet another group has its tap coefficients updated every n ($n > m$) sampling periods; and a further group has its tap coefficients updated at a relatively low frequency, half of the tap coefficients being alternately updated in each sampling period.

The above method, when applied to a system in which the phase characteristic of the sampled data transmission line does not fluctuate appreciably, makes it possible to predict roughly which taps will have high or low coefficients. The taps having high coefficients are constituted by a circuit for updating the coefficients in each sampling period; the taps with their low coefficients are constituted by a circuit for updating the coefficients every j ($j \geq 2$) sampling periods. The taps having the high coefficients are associated significantly with the time to converge tap coefficients in the initial stage of training as well as with the capability to follow up on the gain fluctuation over the transmission line in steady state. Thus, to update the taps having the high coefficients in each sampling period leads to appreciably improving the above convergence time and follow-up characteristic compared with conventional methods. According to the invention, there is provided an equalizing characteristic which involves fewer operations and yet is substantially the same as updating all tap coefficients in each sampling period.

With a system in which the phase characteristic of the transmission line fluctuates significantly, it is difficult to predict which taps have high or low coefficients. Thus according to the invention, there are additionally provided comparators that compare the output of each tap coefficient with the absolute value thereof. If a comparator judges that the absolute value of a given tap coefficient is greater than the output thereof, that tap is connected to the circuit for updating tap coefficients in every sampling period. If a comparator judges that the output of a given tap coefficient is greater than the absolute value thereof, that tap is connected to the circuit for updating tap coefficients every n (n≧2) sampling periods. The comparators need not operate in each sampling period; they need only act individually with respect to each tap and at the frequency compatible with the fluctuation characteristic of the transmission line. In this manner, the invention makes the amount of operations per sampling period lower than the prior art circuit that updates all tap coefficients in every sampling period. At the same time, the above-described improved convergence time and follow-up characteristic are also made available with the invention.

BRIEF DESCRIPTION OF THE DRAWINGS

FIG. 6 (A) is a view illustrating a typical input signal for use with the embodiments;

FIG. 6 (B) is a view showing another representative input signal for use with the embodiments;

FIG. 6 (C) is a view plotting tap coefficients associated with the input signal of FIG. 6 (B)

DESCRIPTION OF THE PREFERRED EMBODIMENTS

Figure 1:
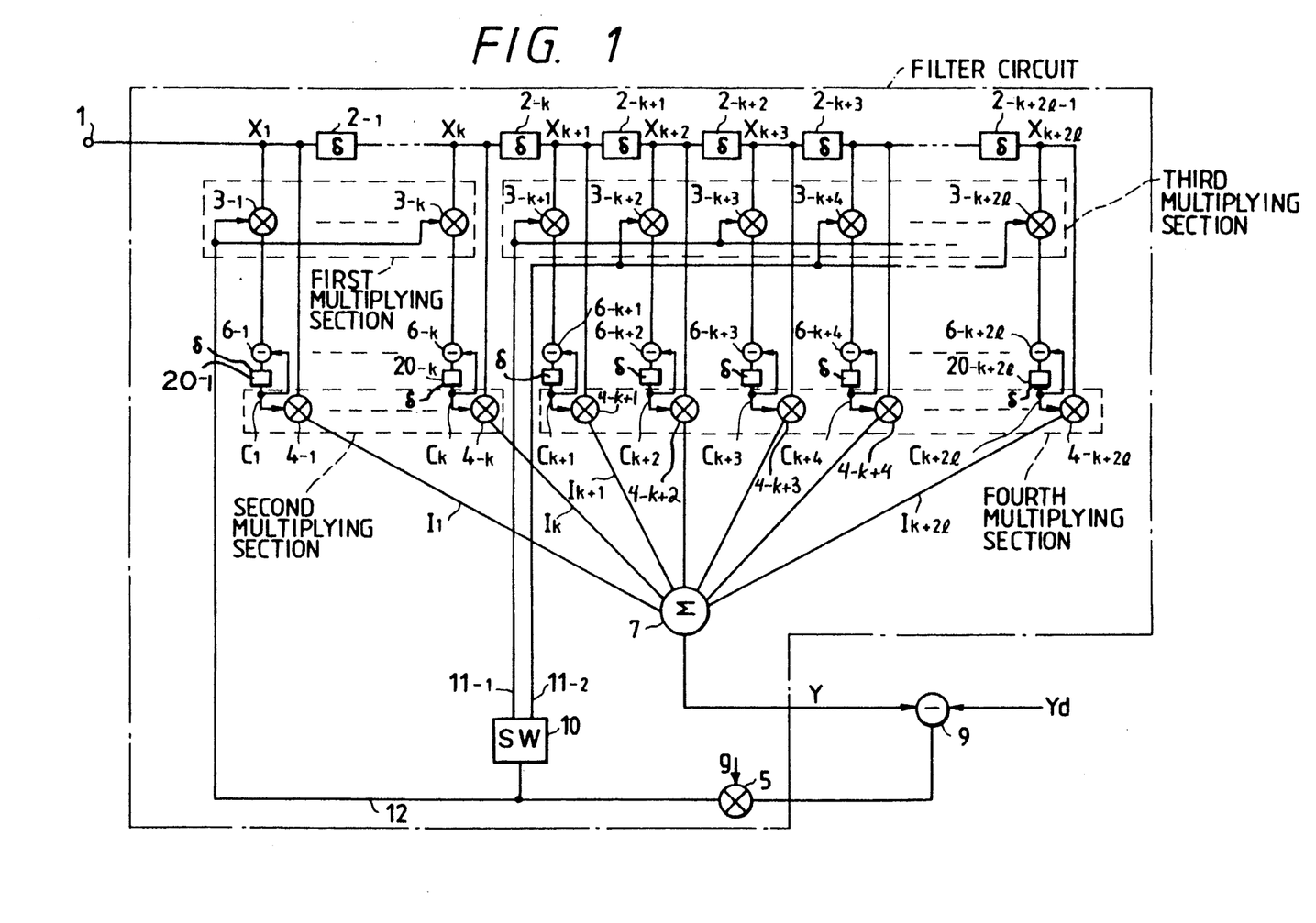
FIG. 1 is a logic circuit diagram of an automatic equalizer as a first embodiment of the invention.

FIG. 1 shows an automatic equalizer as the first embodiment of the invention for use with a system in which the phase characteristic of the transmission line does not fluctuate significantly.

In FIG. 1, input data Xi (i=1→k+2l) is input consecutively via an input terminal 1 into delay elements 2-$i$ (i=1→(k+2l−1)), the elements 2-$i$ each having a delay time corresponding to the sampling period involved. Multipliers 4-$i$ (i=1→(k+(2l)) multiply adjustable tap coefficients Ci (i=1→(k+2l)) by the input data Xi. An adder 7 generates an output of $$Y = \sum_{i=1}^{k+2l} C_i \cdot X_i$$

A subtracter 9 performs a "Y−Yd" operation, where Yd is a discriminated i identifying signal. A multiplier 5 multiplies the output of the subtracter 9 by a tap update coefficient g (i.e., g·(Y−Yd)).

Multipliers 3-$i$ (i=1→k) multiply a sampling signal Xi (i=1→k) by the output of the multiplier 5 (g·(Y−Yd)). Subtracters 6-$i$ (i=1→k) subtract the output of the multipliers 3-$i$ from that of delay elements 20-$i$ (i=1→k) each having a delay time corresponding to the sampling period (i.e., preceding tap coefficient). The result is the updated tap coefficients. This update operation is given by the equation $$C_i^m = C_i^{m-1} - g \cdot X_i \cdot (Y - Y_d) \quad (i = 1 \to k)$$

Meanwhile, the output of the multiplier 5 is routed alternately to either of two lines 11-1 and 11-2 every sampling period by a switching circuit 10.

Odd-numbered multipliers 3-$i$ (i=k+1, k+3, ...) multiply the signal placed onto the line 11-1, i.e., the result of g·(Y−Yd), i.e., by the sampling signal Xi (i=k+1, k+3, ...). Even-numbered multipliers 3-$i$ (i=k+2, k+4, ...) multiply the signal placed onto the line 11-2, also the result of g·(Y−Yd), by the sampling signal Xi (i=k+2, k+4, ...). The outputs of the multipliers 3-$i$ are subtracted by subtracters 6-$i$ (i=k+1→k+1) from the preceding tap coefficients. During the subtraction, the even-numbered tap coefficients are subtracted from $C_i^{2m-2}$; the odd-numbered tap coefficients are subtracted from $C_i^{2m-1}$. The result of the subtraction is regarded as newly updated tap coefficients. That is, the update operations on the tap coefficients $C_{k+1} \to C_{k+2l}$ are given by the equations $$C_i^{2p} = C_i^{2p-2} - g \cdot X_i \cdot (Y - Y_d)$$
$$(i = k+2, k+4, \ldots, k+2l)$$

$$C_i^{2p+1} = C_i^{2p-1} - g X_i (Y - Y_d)$$
$$(i = k+1, k+3, \ldots, k+2l-1)$$

In other words, the entire tap coefficients Ci (i=(k+1)→(k+2l)) are updated every two sampling periods.

Figure 6A:
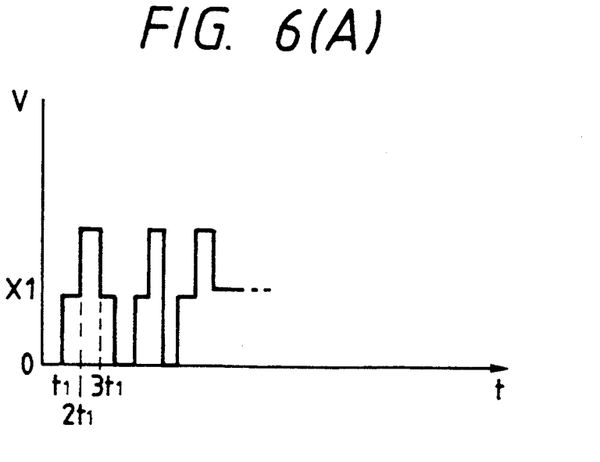

FIG. 6 (A) depicts a representative input signal to be applied to the input terminal 1 in the first embodiment of FIG. 1. The input signal, supplied every t1 sampling periods to the input terminal 1, is forwarded past the delay element 2-1 and into the delay element 2-2 of the next stage. In this manner, the input signal is shifted consecutively up to the delay element 2−(k+(2l−1)) of the last stage.

Figure 6B:
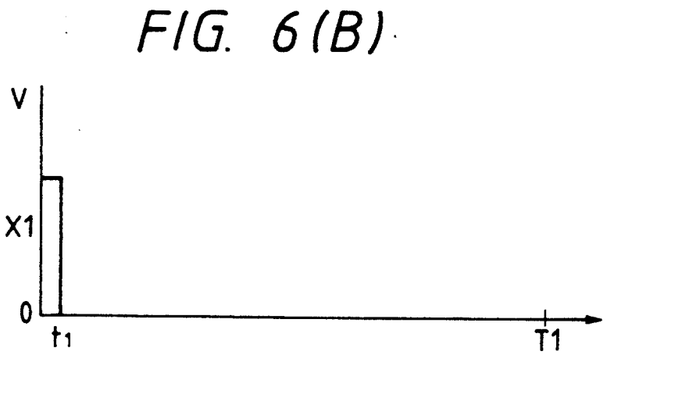
Figure 6C:
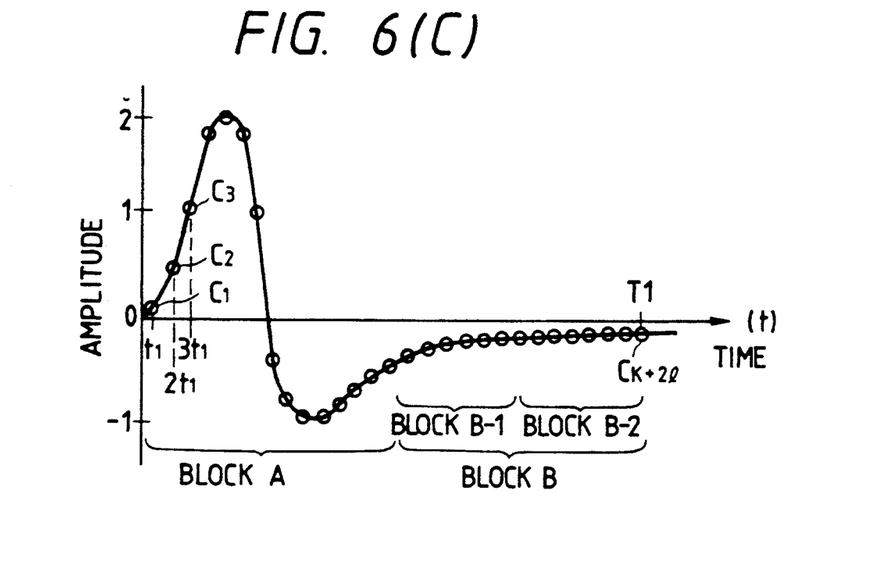

FIG. 6 (B) illustrates another typical input signal to be supplied via the input terminal 1 in the first embodiment. In FIG. 6 (b), only one input signal pulse is shown to be supplied during a sampling period T1 for the sake of simplifying the description of a filter circuit. FIG. 6 (C) depicts the tap coefficients Ci (i=1→(k+2l)) with respect to the input signal of FIG. 6 (B). The horizontal and the vertical axes of FIG. 6 (C) represent time and amplitude values, respectively. In FIG. 6 (C), the hollow circles each stand for an actually output tap coefficient. In a system in which the phase characteristic of the transmission line does not fluctuate appreciably, impulse values may be divided into two blocks A and B as depicted, block A comprising high tap coefficients, block B containing low tap coefficients. For example, in the echo canceler for use with an ISDN (integrated services digital network) subscriber line transmitter, tap coefficients $C_1$ through $C_{15}$ are greater than tap coefficients $C_{16}$ and up when a plurality of subscriber lines are connected thereto. This allows the tap coefficients to be divided into the two blocks A and B. Block A corresponds to the tap coefficients $C_1$ through $C_k$ of FIG. 1.

Because the tap coefficients fluctuate appreciably both in initial convergence time and in steady state, update operations are performed in each sampling period by a first multiplying section made of the multipliers 3-1 through 3-k. On the basis of the tap coefficients updated by the first multiplying section, a second multiplying section made of the multipliers 4-1 through 4-k generates input signals $I_1$ through $I_k$ destined for the adder 7. Block B corresponds to the tap coefficients $C_{k+1}$ through $C_{k+2l}$ of FIG. 1. Because the tap coefficients of block B are smaller than those of block A and because the value fluctuation in steady state tends to be slow, a third multiplying section made of the multipliers 3 -(k+1) through 3 -( k+2l) alternately updates every other tap coefficient in each sampling period. This scheme reduces the total amount of operations per sampling period.

A fourth multiplying section made of the multipliers 4 -(k+1) through 4 -(k+2l) generates input signals $I_{k+1}$ through $I_{k+2l}$ towards the adder 7 by use of the updated or preceding tap coefficients. That is, the newly updated tap coefficients are used by the fourth multiplying section as they are for the signal generation; those not updated in the current sampling period are in fact the same as the preceding tap coefficients and are still used by the fourth multiplying section as the basis for the above signal generation.

As described, the first, the second and the fourth multiplying sections have all of their internal multipliers carry out operations in every sampling period, whereas the third multiplying section has only half of its internal multipliers perform operations per sampling period. With the first embodiment of the invention, the frequency at which to update tap coefficients varies depending on the magnitude thereof. This makes it possible to reduce the total number of operations per sampling period. The first embodiment also ensures the initial convergence time and the follow-up characteristic equivalent to those provided by conventional circuits that update all tap coefficients in every sampling period.

Figure 2:
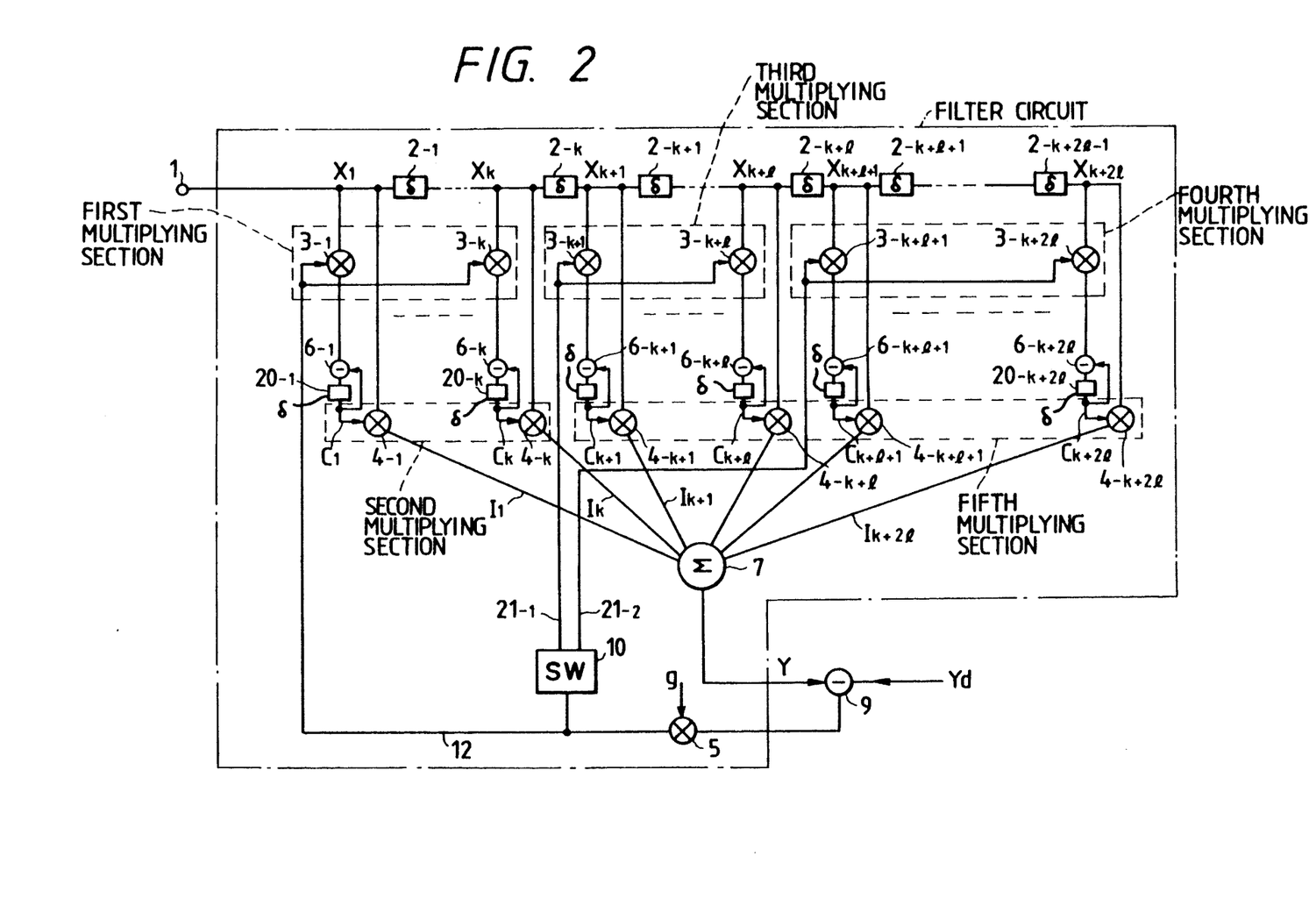
FIG. 2 is a logic circuit diagram of an automatic equalizer as a second embodiment of the invention.

FIG. 2 is a logic circuit diagram of an automatic equalizer as the second embodiment of the invention, the embodiment being used in a system in which the phase characteristic of the transmission line does not fluctuate appreciably. In both FIGS. 1 and 2, like reference characters designate like or corresponding parts.

The output operations of the automatic equalizer as well as its update operations on the tap coefficients $C_1$ through $C_k$ are the same in both FIGS. 1 and 2, and any repetitive description of these aspects is omitted accordingly.

For update operations on the tap coefficients $C_{k+1}$ through $C_{k+2l}$, the connection of lines 21-1 and 21-2 to the multipliers 3-i in FIG. 2 is different from that in FIG. 1. That is, the line 21-1 is connected to the multipliers 3-i (i=k+1→k+l) and the line 21-2 to the multipliers 3-i (i=k+l+1→k+2l). Thus the tap coefficients are updated by the equations $$C_i^{2p} = C_i^{2p-2} - g \cdot X_i \cdot (Y - Y_d)$$
$$(i = k + 1 \rightarrow k + l)$$

$$C_i^{2p+1} = C_i^{2p-1} - g \cdot X_i \cdot (Y - Y_d)$$
$$(i = k + l + 1 \rightarrow k + 2l)$$

The update operations on the tap coefficients Ci (i=k+1→K+2l) are divided into two groups of taps, i.e., the first half and the second half. As in FIG. 1, all tap coefficients Ci (i=k+1→k+2l) are updated every two sampling periods. That is, block A of FIG. 6 (C) corresponds to the tap coefficients $C_1$ through $C_k$ in FIG. 2, the values thereof fluctuating significantly both in the initial convergence time and in steady state. Thus in each sampling period, the first multiplying section made of the multipliers 3-1 through 3-k performs update operations. On the basis of the tap coefficients updated by the first multiplying section, the second multiplying section made of the multipliers 4-1 through 4-k generates the input signals $I_1$ through $I_k$ for the adder 7. Block B-1 in FIG. 6 (C) corresponds to the tap coefficients $C_{k+1}$ through $C_{k+l}$ in FIG. 2, and block B-2 to the tap coefficients $C_{k+l+1}$ through $C_{k+2l}$ in the respective figures. Because the tap coefficients in blocks B-1 and B-2 are smaller and their fluctuations slower than those in block A, the third multiplying section made of the multipliers 3 -(k+1) through 3 -(k+1) and the fourth multiplying section made of the multipliers 3 - (k+l+1) through 3 -(k+2l) are made to operate alternately. That is, the two multiplying sections alternately update half of the tap coefficients in each sampling period, thereby reducing the total amount of operations per sampling period. A fifth multiplying section made of the multipliers 4 -(k+1) through 4 -(k+2l) generates the input signals $I_{k+1}$ through $I_{k+2l}$ for the adder 7 by use of the updated or preceding tap coefficients. That is, the newly updated tap coefficients are used by the fifth multiplying section as they are for the signal generation; those not updated in the current sampling period are in fact the same as the preceding tap coefficients and are still used by the fifth multiplying section as the basis for the above signal generation.

As described, the first, the second and the fifth multiplying sections have all of their internal multipliers carry out operations in every sampling period, whereas the third and the fourth multiplying sections have their internal multipliers perform operations every two sampling periods. With the second embodiment of the invention, the frequency at which to update tap coefficients varies depending on the magnitude thereof. This makes it possible to reduce the total number of operations per sampling period. The second embodiment also ensures the initial convergence time and the follow-up characteristic equivalent to those provided by conventional circuits that update all tap coefficients in every sampling period.

Figure 4:
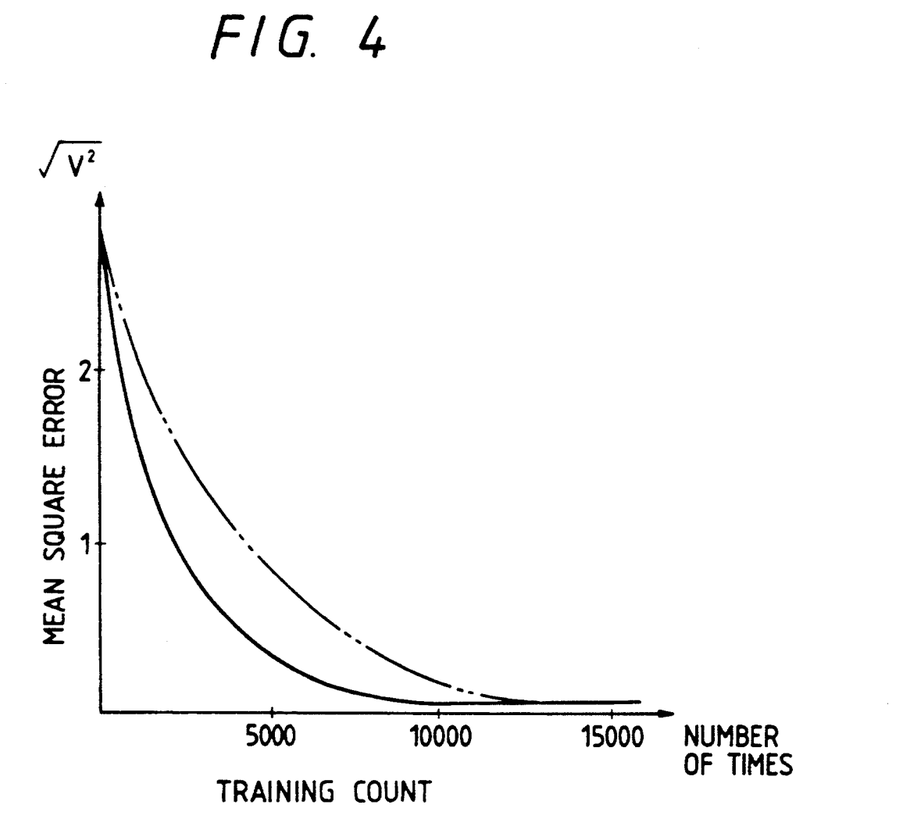
FIG. 4 is a view showing how the tap coefficient training count is related to error occurrences.

FIG. 4 illustrates initial convergence characteristics of tap coefficients. With the circuit of FIG. 2 in use, the total number of taps is set for 50. The initial convergence characteristic shown by the solid line in FIG. 4 applies where the tap coefficients $C_1$ through $C_{15}$ are updated in each sampling period and where the tap coefficients $C_{15}$ through $C_{50}$ are updated every two sampling periods. The horizontal axis stands for training counts, and the vertical axis for mean square errors.

In FIG. 4, the characteristic shown by the solid line represents a convergence characteristic that is fully equivalent to that of automatic equalizers that update all tap coefficients in each sampling period. That is, the comparable equalizing characteristic is maintained while the amount of operations per sampling period is reduced. In FIG. 4, the characteristic shown by the two-dot chain line is the convergence characteristic of conventional equalizers such as the one disclosed in Japanese Patent Laid-Open No. 59-139717, the equalizers updating odd- and even-numbered tap coefficients alternately regardless of the magnitude thereof.

Figure 3:
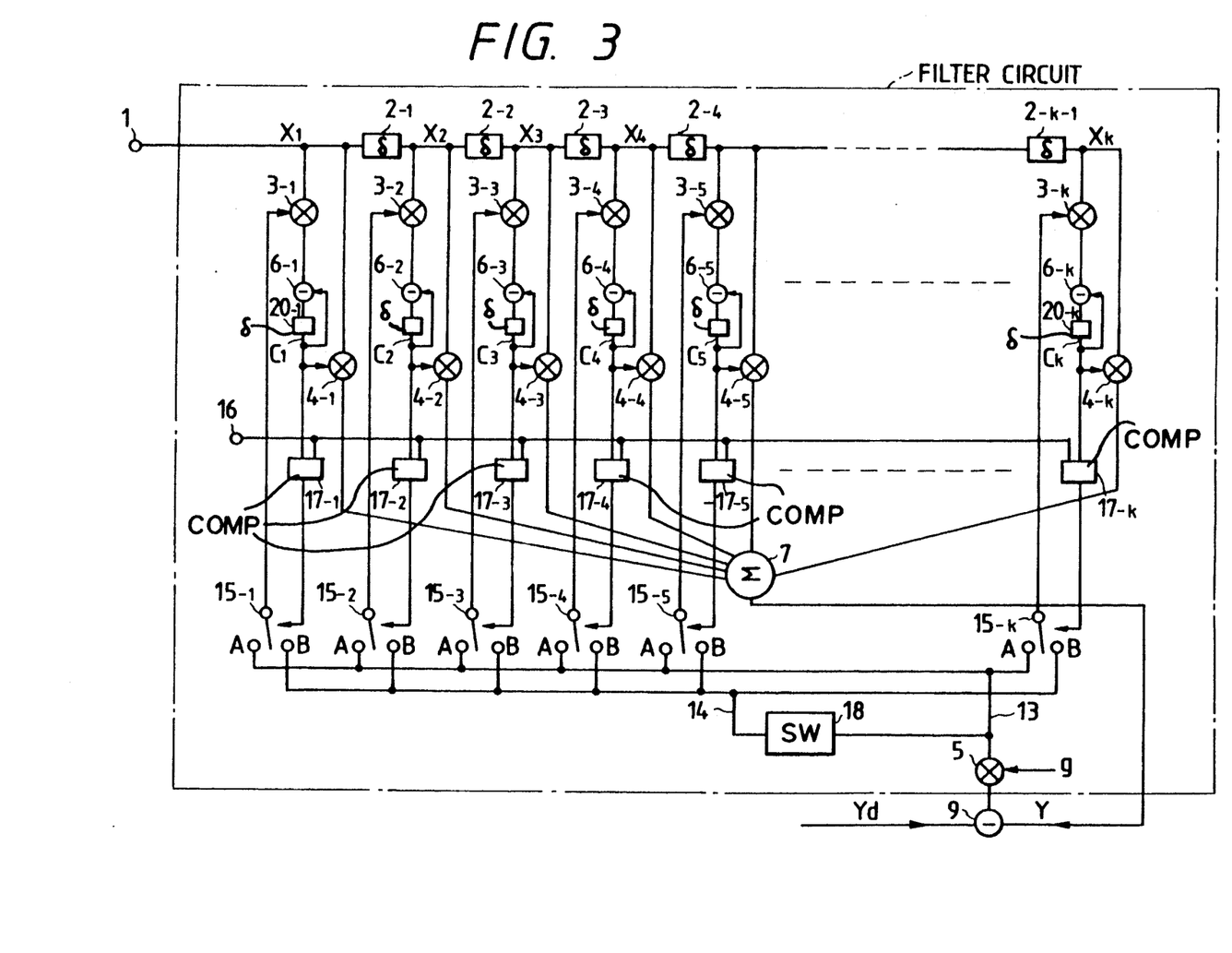
FIG. 3 is a logic circuit diagram of an automatic equalizer as a third embodiment of the invention.

FIG. 3 is a logic circuit diagram of an automatic equalizer as the third embodiment of the invention for use illustratively in an audio signal transmission system in which the phase characteristic of the transmission line fluctuates significantly. In both FIGS. 1 and 3, like reference characters designate like or corresponding parts.

The output operations by the automatic equalizer of FIG. 3 are the same as those in FIG. 1, given by the equation $$Y = \sum_{\lambda=1}^{k} Ci \cdot Xi$$

The tap coefficients Ci are input not only to the multipliers 4-i but also to comparators 17-i. The comparators 17-i compare the absolute values of the tap coefficients with the tap coefficients input from an input terminal 16. If the absolute value of a given tap coefficient is greater than the coefficient from the input terminal upon comparison, a 1 is output; if the absolute value is smaller, a 0 is output. The multiplier 5 weights the output of the subtracter 9 by g. The output of the subtracter 9 is connected via a line 13 to terminals A of switching circuits 15-i (i=1→k) on the one hand, and to a switching circuit 18 on the other. The switching circuit 18 conducts every n (n≧2) sampling periods. The output of the switching circuit 18 is connected via a line 14 to terminals B of the switching circuits 15-i (i=1→k). The switching circuits 15-i are connected to the terminals A when the output of the comparators 17-i (i=1→k) is 1, and are connected to the terminals B when the output of the comparators 17-i is 0. The output of the switching circuits 15-i is connected to the multipliers 3-i for use in updating tap coefficients.

The third embodiment updates tap coefficients as follows:

When the third embodiment of the automatic equalizer; enters its initial convergence stage, the tap coefficients are all cleared to zero. Thus upon start of training, the output of the comparators 17-i is 0, and the switching circuits 15-i are all connected to the terminals B. All tap coefficients are updated using the equation $$Ci^m = Ci^{m-n} - g \cdot Xi(Y - Yd)$$

where, i=1 through k and n≧2.

As the tap coefficients converge, they become greater in value. Some taps cause the corresponding comparators 17-i to output 1's. The switching circuits 15-i connected to the taps that therefor caused comparators 17-i to output 1's are switched from the terminals B to the terminals A. As the transmission line characteristic fluctuates, the switching circuits 15-i alternate between the terminals adaptively in accordance with the magnitude of the tap coefficients Ci. Thus in steady state, the tap coefficients are updated using either the equation $$Ci^m = Ci^{m-1} - g \cdot Xi(Y - Yd)$$
(i = any number between 1 and k)

or the equation $$Ci^m = Ci^{m-n} - g \cdot Xi(Y - Yd)$$

depending on the relationship between tap coefficients and their reference values.

The comparators 17-i need not operate in every sampling period; they may act independently for the respective taps. Furthermore, the comparators need only operate in cycles that allow them to follow up on the fluctuation of the transmission line characteristic. Thus having the comparators compare one tap per sampling period amounts to the addition of one operation per sampling period. On the other hand, there is assumed a case in which the total number of taps is 50 and in which 16 of the switching circuits 15-i are connected to the terminals A and the remaining 34 to the terminals B. In that case, the above scheme performs 17 update operations fewer per sampling period than conventional arrangements for updating all tap coefficients in every sampling period. Since the taps with high coefficients are updated in each sampling period, the follow-up characteristic in steady state does not deteriorate.

Figure 5:
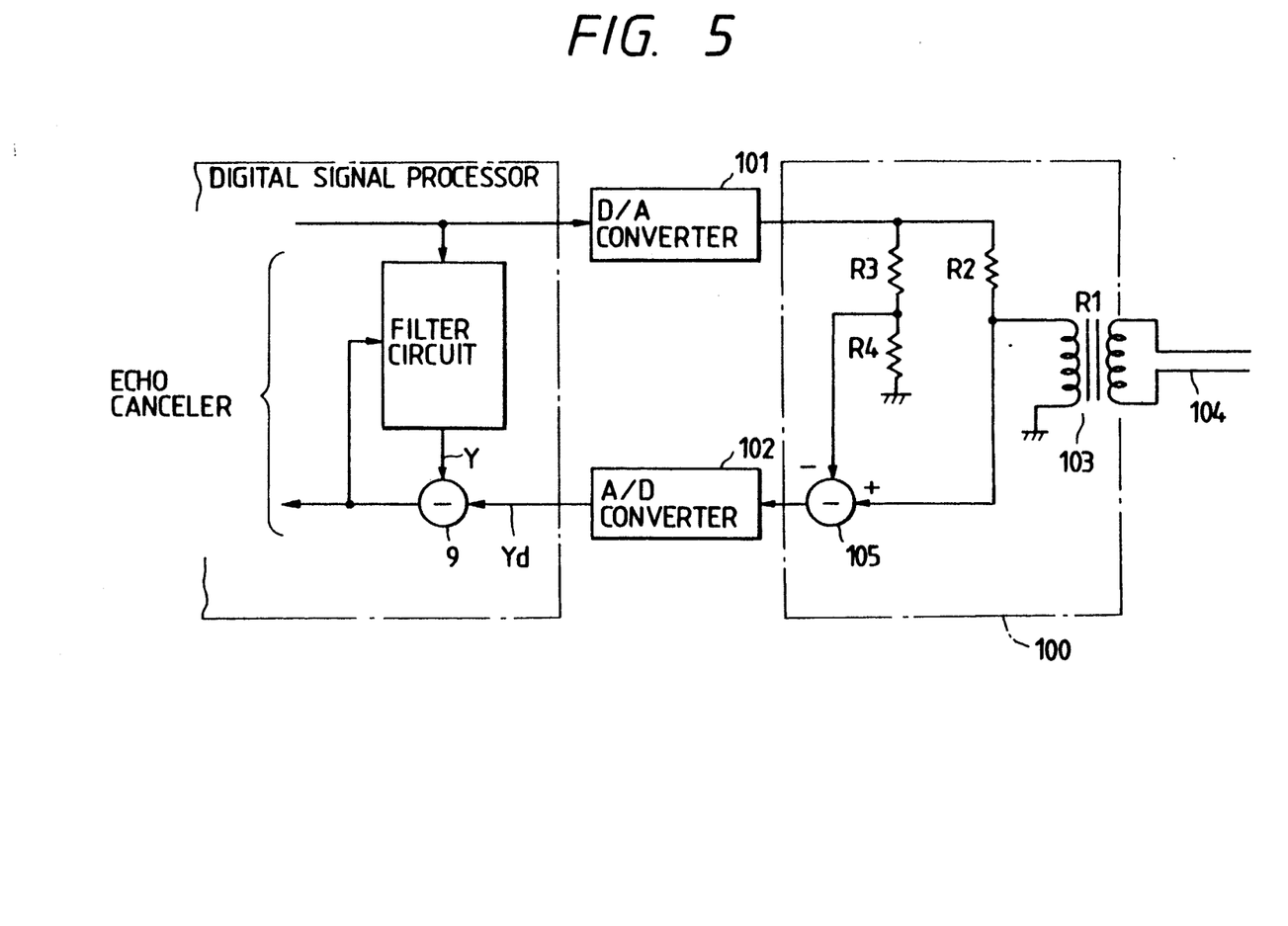
FIG. 5 is a block diagram depicting any of the embodiments being applied to an echo canceler in an ISDN transmitter.

FIG. 5 shows how the above-described automatic equalizer is applied illustratively to the echo canceler for use with an ISDN transmitter. The ISDN transmitter is connected to a telephone line via a balancing network circuit 100. A D/A (digital-to-analog) converter 101 converts transmit data into an analog signal of a plurality of levels, the signal being fed to the balancing network circuit 100. A receive analog signal from the balancing network circuit 100 is converted by an A/D (analog-to-digital) converter 102 into a digital signal, the latter signal being sent to the downstream side of the transmitter. The balancing network circuit 100 removes the voltage component of the transmit analog signal from the voltage component provided by the telephone line 104 via a transformer 103. Overall, there are provided direct resistors R3 and R4 having a resistive potential dividing ratio equal to the one furnished by an impedance R1 and a resistor R2 of the transformer 103. The divided potential of the direct resistors R3 and R4 is subtracted by a subtracter 105 from that of the impedance R1 and resistor R2.

A plurality of digital signal processors, interconnected via telephone lines, each perform transmit and receive operations simultaneously. In operation, just as the digital signal processor of FIG. 5 feeds its transmit signal to the telephone line 104 via the D/A converter 101 and transformer 103, a transmit signal from another digital signal processor, not shown, is received concurrently by the processor of FIG. 5 via the telephone line 104, transformer 103 and A/D converter 102. The balancing network circuit 100 comprising the subtracter 105 is provided to prevent part of the transmit signal from the D/A converter 101 from being fed back as a noise component to the A/D converter 102 via the transformer 103.

The balancing network circuit 100 is designed to exclude the intrusive feedback of the transmit signal on the assumption that the transformer 103 has a constant impedance of, say, 135Ω. In practice, however, the impedance is bound to contain errors, and the telephone line status changes over time. Since it is quite impossible to predict the kind of status the connected telephone line will be in, the echo canceler is used to ensure the removal of the undesirable component (i.e., echo component) that sneaks into the receiving side from the transmitting side in practice. This is where any of the filter circuits shown as a black box in FIGS. 1, 2 and 3 comes in. The filter circuit cancels the echo component Yd using the signal Y.

Figure 7:
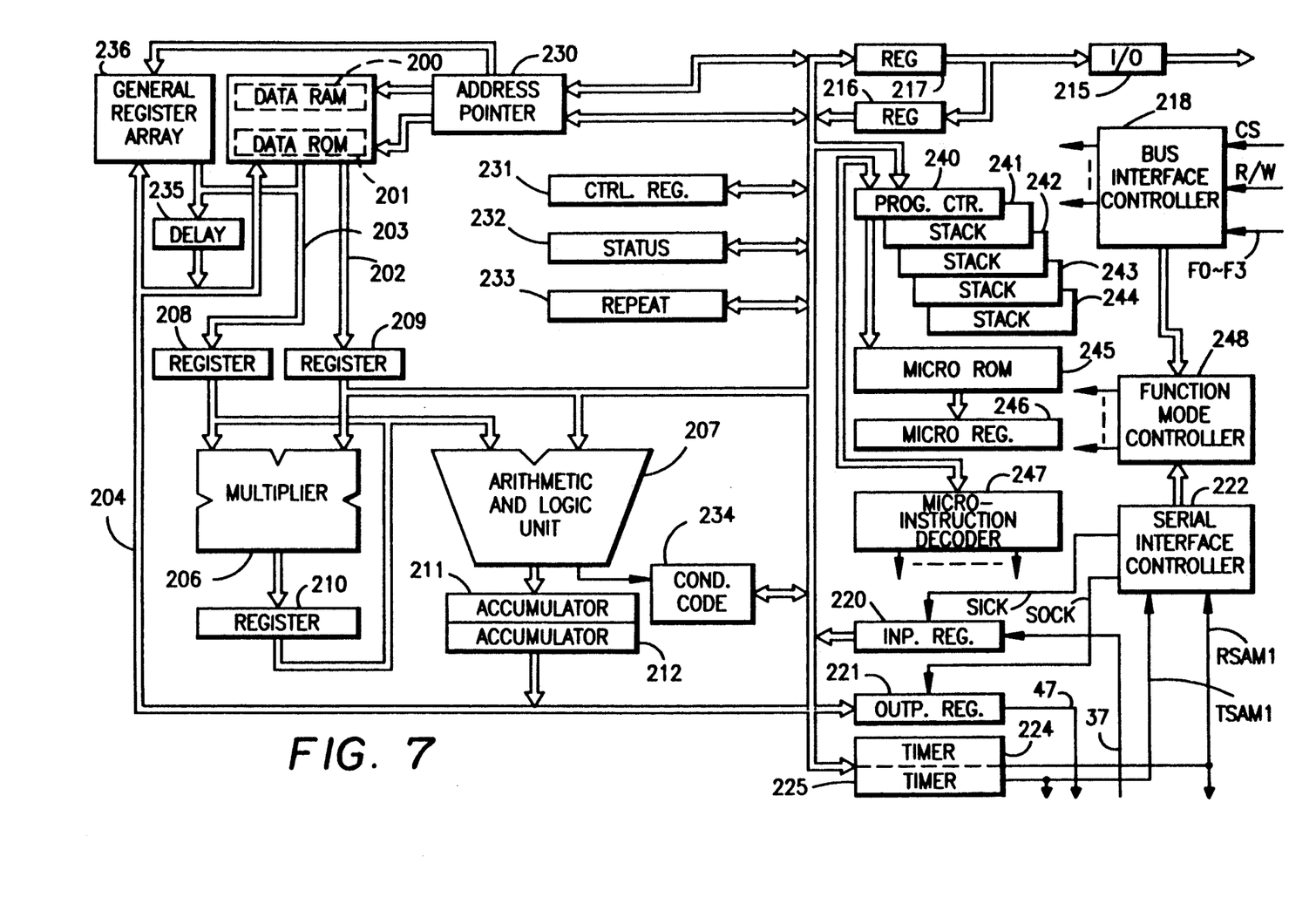
FIG. 7 is a block diagram of a typical digital signal processor to which any of the embodiments may be applied.

FIG. 7 is a block diagram of a typical digital signal processor to which any of the above embodiments may be applied in order to implement the functions of the automatic equalizer.

The digital signal processor of FIG. 7 is built on the so-called Harvard architecture that separates program memory from data memory. In this processor, its operation data transfer section is basically separated from its instruction transfer section. The operating section of the digital signal processor comprises a data RAM 200 and a data ROM 201 which store variable and coefficient data to be handled in digital signal processing. A plurality of data buses 202 through 204 are connected to their corresponding ports of the memories 200 and 201 for parallel data transfer. In addition, a multiplier 206 and an arithmetic and logic unit 207 are provided independently of each other so that multiply and add operations of high frequencies are carried out in parallel. For example, the write port of the data RAM 200 is connected to the data bus 204. The read port of the data RAM 200 and that of the data ROM 201 are connected respectively to the data buses 203 and 202. The data placed onto the data buses 202 and 203 are supplied via registers 208 and 209 to the multiplier 206 and arithmetic and logic unit 207. The multiplier 206 and arithmetic and logic unit 207 are also supplied with data from the data bus 204. The result of the operation by the multiplier 206 is held in a register 210 for one instruction cycle before being fed to the arithmetic and logic unit 207. The arithmetic and logic unit 207 performs add and subtract operations on the data supplied selectively from the register 210 and data RAM 200 or from the data ROM 201 and data bus 204. The results of the operations by the arithmetic and logic unit 207 are held temporarily in accumulators 211 and 212 before being placed back onto the data bus 204.

In FIG. 7, the delay elements 2-$i$ and 20-$i$ shown in FIGS. 1 and 2 are functionally implemented by the data RAM 200; the multipliers 3-$i$, 4-$i$ and 5 are also functionally implemented by the multiplier 206; and the adder 7 and subtracters 6-$i$ and 9 are likewise implemented by the arithmetic and logic unit 207.

The interface between the digital signal processor and an external host processor is provided by a parallel input register 216 and a parallel output register 217, both connected to an input/output buffer 215. Access to the registers 216 and 217 from the outside is controlled by a bus interface controller 218 that supplies a chip select signal CS, a read/write signal R/W and a four-bit function signal F0–F3. The function signal F0–F3 is a control signal that selects any of the registers 216 and 17, a program counter 240 (to be described later) and a control register 231 for a direct read or write operation from the outside, the selection being made based on the logic value combination of the signal bits in the chip selected state. Illustratively, the function signal F0–F3 corresponds to a certain bit in an address signal that is output by the host processor, not shown.

The interface between the A/D converter and the D/A converter is provided by a serial input register 220 and a serial output register 221, both connected to the internal data bus 204. Inputs to and outputs from these registers are controlled, but not limited, by a serial interface controller 222 that receives sampling enable clock signals RSAM1 and TSAM1. The serial interface controller 222 supplies the serial input register 220 with a serial input clock signal SICK in synchronization with the change in the sampling enable clock signal RSAM1, thereby admitting and controlling the data that is input in bit serial format. In addition, the serial interface controller 222 supplies the serial output register 221 with a serial output clock signal SOCK in synchronization with the change in the sampling enable clock signal TSAM1, thereby controlling the data output in bit serial format. The sampling enable clock signals RSAM1 and TSAM2 are output from, but not limited by, programmable timers 224 and 225. The timer settings are established under control of the host processor or under microprogram control.

The data bus 204 is further connected with an address pointer 230, a control register 231, a status register 232, the repeat counter 233, a condition code register 234, a delay register 235 and a general register array 236.

The address pointer 230 is used to address the data RAM 200, data ROM 201 and general register array 236. The status register 232 contains flags that reflect the internal status of the digital signal processor such as the data input/output state of the parallel output register 217 and the interrupt mask state. The control register 231 retains various conditions for controlling the operation of the digital signal processor 1. The repeat counter 233 is used to count the number of times a given repeat instruction (e.g., multiply or add) is executed.

The instruction control section of the digital signal processor comprises, but is not limited by, the program counter 240 that retains the address of the instruction to be executed next; stack registers 241 through 244 that save the values of the program counter 240 up to a nest count of 4 upon an external interruption or upon a jump or branch; a micro ROM 245 which retains an operation program of the digital signal processor illustratively in the form of a plurality of microinstruction sequences and which is addressed by the output of the program counter 240; a microinstruction register 246 that fetches microinstructions output from the micro ROM 245; a microinstruction decoder 247 that decodes microinstructions from the microinstruction register 246 in order to generate various internal control signals; and a function mode controller 248 that provides address control over microinstructions on the basis of interruptions and the like.

In any of the above embodiments, the micro ROM 240 contains the operation program for echo cancellation.

The function mode controller 248 provides instruction address control and interruption control in accordance with the information supplied by the bus interface control 218 or the serial interface controller 222. That information comprises the data for designating input/output operations on the serial input register 220 or serial output register 221 and the data for specifying direct access to internal registers from the outside. Depending on the type of data received, the function mode controller 248 generates the address of the destinations for which o branch microprograms for the necessary processing routine, saves the current resources in effect at a given point in time, or restores the preceding state once the current action is completed. In a sequence in which a group of microinstructions is executed, the next address of the micro ROM 245 may be supplied through, but not limited by, the microinstruction register 246.

To improve the throughput of operation instructions, the micro ROM 245 contains operation programs compatible with a horizontal microinstruction scheme that is capable of executing a plurality of operations in one instruction cycle. The operations that may be executed parallelly in one instruction cycle include an operation by the multiplier 206, an operation by the arithmetic and logic unit 207, and write and read operations to and from the data ROM 201, RAM 200 and various registers. A multiply operation, executable in all instruction cycles, is performed by an instruction selecting the input data of the multiplier 206. The result of the multiply operation is stored in the register 210. In the next instruction cycle, the result of the multiply operation is utilized by the arithmetic and logic unit 207 carrying out add and subtract operations. In this manner, multiply and add operations are parallelly executed under a pipeline scheme, and multiply and add operations are efficiently performed apparently in a single instruction cycle.

The above-described embodiments offer the following major benefits:

(1) In a system where the phase characteristic of the sampled data transmission line does not fluctuate appreciably, it is possible to roughly predict the taps whose coefficients are high and those with low coefficients. In such a case, as depicted in FIGS. 1 and 2, circuits are configured so that the taps with the high coefficients will be updated in each sampling period while the taps with the low coefficients will be updated every two sampling periods. In the automatic equalizer, the taps having the high coefficients are associated significantly with the time to converge tap coefficients in the initial stage of training as well as with the capability to follow up on the gain fluctuation over the transmission line in steady state. Thus, to update the taps having the high coefficients in each sampling period leads to appreciably improving the above convergence time and follow-up characteristic compared with conventional methods. While reducing the amount of operations per sampling period, the invention provides the equalizing characteristic equivalent to that of conventional arrangements for updating all tap coefficients in every sampling period.

(2) In the above setup, as shown in FIG. 2, the tap coefficients are divided into two groups, one comprising the tap coefficients $C_{k+1}$ through $C_{k+l}$, the other containing the tap coefficients $C_{k+l+1}$ through $C_{k+2l}$, each group having its tap coefficients updated independently. This scheme makes it possible within each of the above groups to make contiguous the addresses for consecutively updating the values of delay elements by multiply and add operations, the delay elements being illustratively contained in the data RAM 200 of FIG. ?. That is, address control over the data RAM 200 becomes easier. By contrast, where every second tap is illustratively put into another group so that the tap coefficients will be updated by group (as in the prior art), it is necessary to take into account the fact that address point control becomes complicated unless the delay element storage area is divided by group.

(3) In a system where the phase characteristic of the transmission line fluctuates significantly, it is difficult to predict the taps with high coefficients and those with low coefficients. In that case, as depicted in FIG. 3, the comparators 17-1 through 17-k are added to compare the absolute value of each tap coefficient with the actual output thereof. If a comparator judges that the absolute value of a given tap coefficient is greater than the output thereof, that tap is connected to the circuit for updating tap coefficients in every sampling period. If a comparator judges that the output of a given tap coefficient is greater than the absolute value thereof, that tap is connected to the circuit for updating tap coefficients every multiple sampling periods. The comparators need not operate in each sampling period; they need only act individually with respect to each tap and at the frequency compatible with the fluctuation characteristic of the transmission line. In this manner, the invention makes the amount of operations per sampling period lower than the prior art circuit that updates all tap coefficients in every sampling period. At the same time, the above-described improved convergence time and follow-up characteristic are also made available with the invention.

While preferred embodiments of the invention have been described using specific terms, such description is for illustrative purposes only, and it is to be understood that changes and variations may be made without departing from the spirit and scope of the appended claims. For example, the embodiment of FIG. 3 involves setting up the comparators 17-$i$ and the switching circuits 15-$i$ for all taps. A variation of this embodiment may have the taps divided into a plurality of contiguous blocks, each block being assigned a comparator and a switching circuit. If the total number of taps is 50, the taps may be divided into five blocks (1 to 10, 11 to 20, 21 to 30, 31 to 40, 41 to 50). A comparator arrangement may be added to any of the taps in a given group or to the total sum of the absolute values of the tap coefficients therein. A switching circuit arrangement may operate on the comparator output so as to adjust the frequency for updating the tap coefficients in that block in a unified manner.

The setups in FIGS. 1, 2 and 3 comprise two circuit combinations. One circuit combination contains the circuit for updating tap coefficients in every sampling period and a circuit for updating them every two sampling periods. The other circuit combination contains the circuit for updating tap coefficients in every sampling period and a circuit for updating them every n sampling periods. However, these circuit combinations are not limitative of the present invention. If the total number of taps is large, or if significant differences exist between tap coefficients, the number of operations per unit time may be further reduced by combining three or more circuits for updating three or more groups of tap coefficients at different frequencies. For example, one group may have its tap coefficients updated in each sampling period; another group may let its tap coefficients be updated every m (m≧2) sampling periods; and in another group, its tap coefficients may be updated every n (n>m) sampling periods.

The input terminal of the automatic equalizer in any of FIGS. 1 through 3 may be constituted by a desired number of bits. In addition, the automatic equalizer, together with its analog circuits such as the A/D and D/A converters, may be incorporated in a single chip for use with the digital signal processor.

The above embodiments have adopted a linear filter arrangement. As an alternative, a nonlinear filter scheme may be adopted. Another alternative is to use a nonlinear filter in the area where the tap coefficients need to be updated in each sampling period or where the tap coefficients are expected to be high.

The foregoing description has centered on the echo canceler type transmitter to which the invention is applied. However, this application is not limitative of the invention. The invention may also be applied to diverse filtering processes for modems, voice compression, voice synthesis and image processing.

To sum up, the invention provides the following major advantages:

One circuit arrangement involves varying the frequency at which to update tap coefficients depending on the magnitude thereof. Another circuit arrangement involves setting up a plurality of groups of tap coefficients, one group having its tap coefficients updated in each sampling period, the other groups having their coefficients updated every multiple sampling periods. These arrangements provide the advantage of reducing the total number of operations per unit sampling time while ensuring the equalizing characteristic substantially equivalent to that of conventional equalizers that update all tap coefficients in every sampling period.

For a system whose characteristic fluctuates significantly in steady state, a circuit arrangement is provided to change adaptively the frequency at which to update tap coefficients by monitoring the values thereof. This arrangement reduces the total number of operations per unit sampling time without degrading the equalizing characteristic of the automatic equalizer.

Furthermore, the invention provides a novel semiconductor integrated circuit arrangement for digital signal processing, the arrangement ensuring improved capabilities in terms of converging tap coefficients and following up on the characteristic fluctuation of the sampled data transmission line. Although these capabilities are implemented using only a limited number of digital signal processing steps, they are equivalent to those of automatic equalizers that update tap coefficients in each sampling period.

What is claimed is:

1. An automatic equalizer comprising:
   means for inputting a plurality of input sampling signals;
   means for multiplying each of said plurality of sampling signals by a respective tap coefficient;
   an adding circuit for adding together the sampling signals multiplied by said tap coefficients; and
   updating means for periodically updating said tap coefficients on the basis of the signal output supplied by said adding circuit;
   wherein the frequency at which updating means updates said tap coefficients is varied depending on the respective magnitudes of said tap coefficients.

2. An automatic equalizer as claimed in claim 1, wherein said updating means updates those tap coefficients having a magnitude greater than a predetermined value at a higher frequency than those tap coefficients having a magnitude less than the predetermined value.

3. A semiconductor integrated circuit comprising:
   a digital signal processor incorporated in a single semiconductor chip, said digital signal processor including an automatic equalizer having:
   means for inputting a plurality of input sampling signals;
   means for multiplying each of said plurality of sampling signals by a respective tap coefficient;
   an adding circuit for adding together the sampling signals multiplied by said tap coefficients; and
   updating means for periodically updating said tap coefficients on the basis of the signal output supplied by said adding circuit;
   wherein the frequency at which said updating means updates said tap coefficients is varied depending on the respective magnitudes of said tap coefficients.

4. An automatic equalizer comprising:
   means for inputting a plurality of input sampling signals;
   means for multiplying each of said plurality of sampling signals by a respective tap coefficient;
   an adding circuit for adding together the sampling signals multiplied by said tap coefficients; and
   updating means for periodically updating said tap coefficients on the basis of the signal output supplied by said adding circuit;
   wherein said tap coefficients comprise a plurality of tap coefficient groups, and wherein one group of tap coefficients is updated in each sampling period and other groups of tap coefficients are updated in predetermined multiples of sampling periods.

5. A semiconductor integrated circuit comprising:
   a digital signal processor incorporated in a single semiconductor chip, said digital signal processor including an automatic equalizer having:
   means for inputting a plurality of input sampling signals;
   means for multiplying each of said plurality of sampling signals by a respective tap coefficient;
   an adding circuit for adding together the sampling signals multiplied by said tap coefficients; and
   updating means for periodically updating said tap coefficients on the basis of the signal output supplied by said adding circuit;
   wherein said tap coefficients comprise a plurality of tap coefficient groups, and wherein one group of tap coefficients is updated in each sampling period and other groups of tap coefficients are updated in predetermined multiples of sampling periods.

6. An automatic equalizer comprising:
   means for inputting a plurality of input sampling signals;
   means for multiplying each of said plurality of sampling signals by a respective tap coefficient;
   an adding circuit for adding together the sampling signals multiplied by said tap coefficients; and
   updating means for periodically updating said tap coefficients on the basis of the signal output supplied by said adding circuit;
   wherein said tap coefficients comprise a plurality of tap coefficient groups, and wherein a first group of tap coefficients is updated at a first frequency and a second group of tap coefficients is updated at a second frequency that is lower than the first frequency, said first and second frequencies being determined in accordance with the respective magnitudes of said tap coefficients.

7. An automatic equalizer according to claim 6, wherein each of said groups of tap coefficients is updated at a different frequency.

8. An automatic equalizer according to claim 7, wherein one of said groups of tap coefficients is updated in each sampling period, another of said groups of tap coefficients is updated every m (m≧2) sampling periods, and a further one of said groups of tap coefficients is updated every n (n>m) sampling periods.

9. An automatic equalizer according to claim 6, wherein said second group of tap coefficients comprises two subgroups of tap coefficients, the two subgroups being respectively updated in alternate sampling periods.

10. An automatic equalizer as claimed in claim 6, wherein said updating means updates those tap coefficients having a magnitude greater than a predetermined value at a higher frequency than those tap coefficients having a magnitude less than the predetermined value.

11. A semiconductor integrated circuit comprising:
    a digital signal processor incorporated in a single semiconductor chip, said digital signal processor including an automatic equalizer having:

means for inputting a plurality of input sampling signals;

means for multiplying each of said plurality of sampling signals by a respective tap coefficient;

an adding circuit for adding together the sampling signals multiplied by said tap coefficients; and updating means for periodically updating said tap coefficients on the basis of the signal output supplied by said adding circuit;

wherein said tap coefficients comprise a plurality of tap coefficient groups, and wherein a first group of tap coefficients is updated at a first frequency and a second group of tap coefficients is updated at a second frequency that is lower than the first frequency, said first and second frequencies being determined in accordance with the respective magnitudes of said tap coefficients.

12. An automatic equalizer comprising:

means for inputting a plurality of input sampling signals;

means for multiplying each of said plurality of sampling signals by a respective tap coefficient;

an adding circuit for adding together the sampling signals multiplied by said tap coefficients;

updating means for periodically updating said tap coefficients on the basis of the signal output supplied by said adding circuit; and comparing means for comparing absolute values of said tap coefficients with a predetermined value;

wherein the frequency at which said updating means updates said tap coefficients is varied depending on the respective results of comparisons performed by said comparing means.

13. An automatic equalizer as claimed in claim 12, wherein said comparing means performs the comparison respecting those tap coefficients having an absolute value greater than the predetermined value at a higher frequency than those tap coefficients having an absolute value less than the predetermined value.

14. An automatic equalizer as claimed in claim 12, wherein said comparing means performs the comparison respecting all said tap coefficients during each updating period.

15. A semiconductor integrated circuit comprising:

a digital signal processor incorporated in a single semiconductor chip, said digital signal processor including an automatic equalizer having:

means for inputting a plurality of input sampling signals;

means for multiplying each of said plurality of sampling signals by a respective tap coefficient;

an adding circuit for adding together the sampling signals multiplied by said tap coefficients;

updating means for periodically updating said tap coefficients on the basis of the signal output supplied by said adding circuit; and comparing means for comparing absolute values of said tap coefficients with a predetermined value;

wherein the frequency at which said updating means updates said tap coefficients is varied depending on the respective results of comparisons performed by said comparing means.

16. In an echo canceler-type transmitting device for data transmission, an automatic equalizer comprising:

means for inputting a plurality of input sampling signals;

means for multiplying each of said plurality of sampling signals by a respective tap coefficient;

an adding circuit for adding together the sampling signals multiplied by said tap coefficients; and updating means for periodically updating said tap coefficients on the basis of the signal output supplied by said adding circuit;

wherein the frequency at which said updating means updates said tap coefficients is varied depending on the respective magnitudes of said tap coefficients.

17. In an image processing system, an automatic equalizer comprising:

means for inputting a plurality of input sampling signals;

means for multiplying each of said plurality of sampling signals by a respective tap coefficient;

an adding circuit for adding together the sampling signals multiplied by said tap coefficients; and updating means for periodically updating said tap coefficients on the basis of the signal output supplied by said adding circuit;

wherein the frequency at which said updating means updates said tap coefficients is varied depending on the respective magnitudes of said tap coefficients.

* * * * *